US012422903B2

(12) United States Patent
Lee et al.

(10) Patent No.: US 12,422,903 B2
(45) Date of Patent: Sep. 23, 2025

(54) INDEPENDENT GRAPHICS CARD SYSTEM, COMPUTER HOST AND COMPUTER

(71) Applicants: HONGFUJIN PRECISION INDUSTRY (WUHAN) CO., LTD., Wuhan (CN); HON HAI PRECISION INDUSTRY CO., LTD., New Taipei (TW)

(72) Inventors: Sung-Hsien Lee, New Taipei (TW); Wen-Ke Wu, New Taipei (TW); Zhi-Feng Wei, Wuhan (CN); Biao Zeng, Wuhan (CN)

(73) Assignees: HONGFUJIN PRECISION INDUSTRY (WUHAN) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 222 days.

(21) Appl. No.: 18/381,321

(22) Filed: Oct. 18, 2023

(65) Prior Publication Data
US 2024/0143045 A1 May 2, 2024

(30) Foreign Application Priority Data
Oct. 31, 2022 (CN) .......................... 202211366132.7

(51) Int. Cl.
*G06F 1/16* (2006.01)
*G06F 1/18* (2006.01)
*G06F 1/20* (2006.01)
*H05K 5/00* (2025.01)
*H05K 7/00* (2006.01)
*H05K 7/14* (2006.01)
*H05K 7/20* (2006.01)

(52) U.S. Cl.
CPC ................ *G06F 1/183* (2013.01); *G06F 1/20* (2013.01); *H05K 7/1429* (2013.01); *H05K 7/20172* (2013.01)

(58) Field of Classification Search
CPC ............ G06F 1/183; G06F 1/20; G06F 1/181; H05K 7/1429; H05K 7/1417; H05K 7/1418; H05K 7/20172; H05K 7/20136
See application file for complete search history.

(56) References Cited

U.S. PATENT DOCUMENTS

| 9,405,336 | B1* | 8/2016 | Li | G06F 1/186 |
| 11,468,735 | B2* | 10/2022 | Timperley | G07F 17/3211 |
| 11,662,784 | B2* | 5/2023 | Lin | G06F 1/181 |
| | | | | 361/679.02 |
| 2010/0007668 | A1* | 1/2010 | Casparian | G09G 5/006 |
| | | | | 345/520 |
| 2015/0294434 | A1* | 10/2015 | Nataros | G06F 13/4221 |
| | | | | 345/520 |
| 2019/0130519 | A1* | 5/2019 | Hu | G06F 1/185 |

(Continued)

Primary Examiner — Anthony M Haughton
(74) Attorney, Agent, or Firm — ScienBiziP, P.C.

(57) ABSTRACT

An independent graphics card system comprises an expansion motherboard, a system power supply, at least one expansion graphics card and a fan assembly. The system power supply is electrically connected to the expansion motherboard. The at least one expansion graphics card is plugged into the expansion motherboard through an adapter card. The at least one expansion graphics card is parallel with the expansion motherboard. The fan assembly dissipates heat of the at least one expansion graphics card.

14 Claims, 6 Drawing Sheets

(56) References Cited

U.S. PATENT DOCUMENTS

2023/0284371 A1* 9/2023 Sun .................. H05K 1/0203
　　　　　　　　　　　　　　　　　　　361/679.47
2024/0069608 A1* 2/2024 Chen .................... G06F 1/20

* cited by examiner

INDEPENDENT GRAPHICS CARD SYSTEM, COMPUTER HOST AND COMPUTER

CROSS-REFERENCE TO RELATED APPLICATIONS

This application claims all benefits under 35 U.S.C. § 119 from the Chinese Patent Application No. 202211366132.7, filed on Oct. 31, 2022, in the China National Intellectual Property Administration, the disclosure of which is incorporated herein by reference.

FIELD

The invention relates to an independent graphics card system, a computer host and a computer having the independent graphics card system.

BACKGROUND

Functions of a graphics card are to convert and drive the display information required by the computer system and provide data signals to a display. In a chassis of a current computer host, multiple graphics card slots are provided on the motherboard, and the graphics cards are vertically inserted into the graphics card slots. Due to certain work requirements, the requirements, such as high-power requirements, for graphics card performance can be higher. To achieve high power, it may be necessary to insert multiple graphics cards on the motherboard. However, the graphics card slot on the motherboard is limited and can only be expanded to some extent. Moreover, high-power graphics cards usually require independent power input, which requires changes in designing the computer layout and power supply. However, changes in designs may bring other problems and constraints. Furthermore, even if all graphics cards are included in a system, the cooling problem still needs to be solved.

BRIEF DESCRIPTION OF THE DRAWINGS

In order to illustrate the technical solutions of the embodiments of the present application more clearly, the accompanying drawings in the embodiments will be briefly introduced below. It should be understood that the following drawings only show some embodiments of the present application, and therefore should not be seen as limiting the scope. For one of ordinary skill in the art, other related drawings can also be obtained from these drawings without any creative work.

Implementations of the present technology will now be described, by way of embodiments, with reference to the attached figures, wherein.

DETAILED DESCRIPTION

Figure 1:
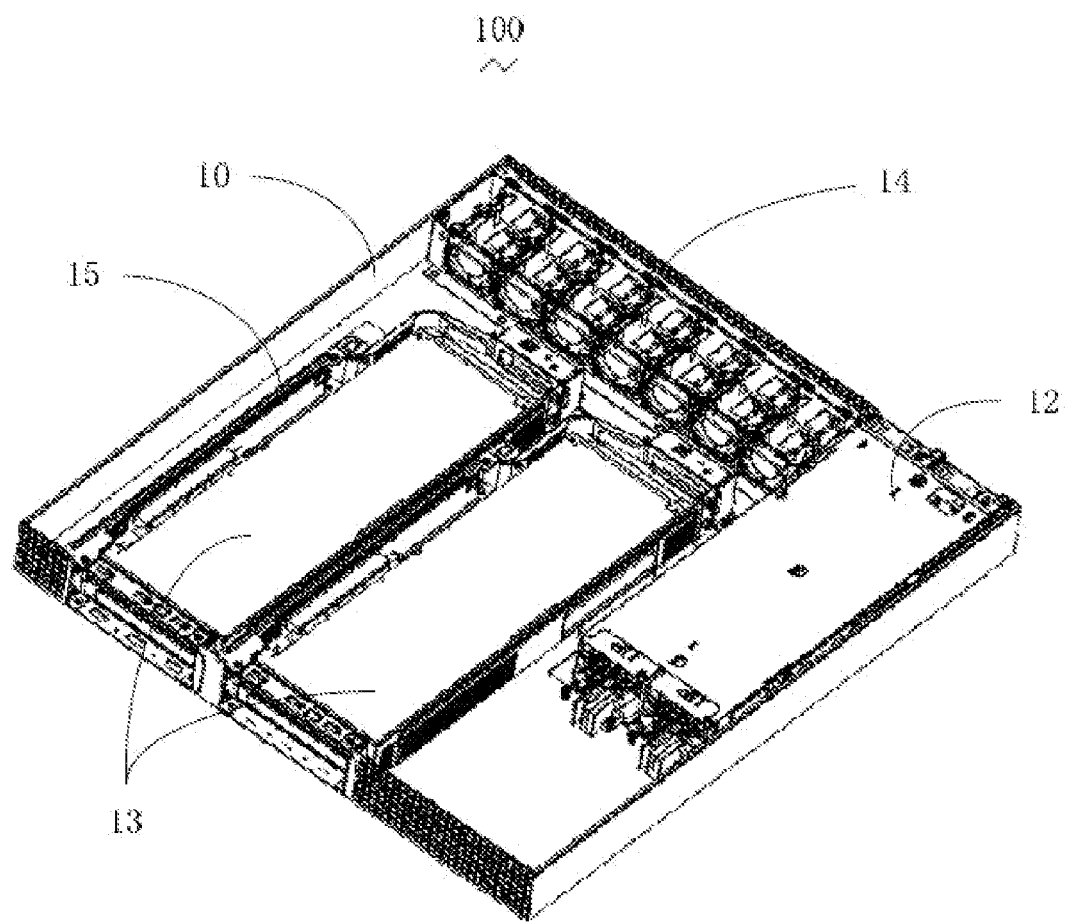
FIG. 1 is a schematic structural diagram of an independent graphics card system provided by Embodiment 1 of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale, and the proportions of certain parts may be exaggerated better illustrate details and features. The description is not to be considered as limiting the scope of the embodiments described herein.

The term "outside" refers to a region that is beyond the outermost confines of a physical object. The term "inside" indicates that at least a portion of a region is partially contained within a boundary formed by the object. The term "substantially" is defined to essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

The independent graphics card system provided by the present invention, the computer host and the computer having the independent graphics card system will be further described in detail below with reference to the accompanying drawings and specific embodiments.

An embodiment of the present invention provides an independent graphics card system. The independent graphics card system includes an expansion motherboard, a system power supply, at least one expansion graphics card, and a fan assembly. The system power supply is electrically connected to the expansion motherboard, and the expansion graphics card is plugged into the expansion motherboard through an adapter card. The expansion motherboard comprises an adapter card slot. One end of the adapter card comprises a gold finger, and the other end comprises a graphics card slot. The gold finger of the adapter card is plugged into the adapter card slot of the expansion motherboard. The expansion graphics card is inserted into the graphics card slot of the adapter card, so that the expansion graphics card is inserted into the expansion motherboard. The expansion graphics card is arranged parallel to the expansion motherboard. The fan assembly dissipates heat of the expansion graphics card.

Embodiment One

Figure 2:
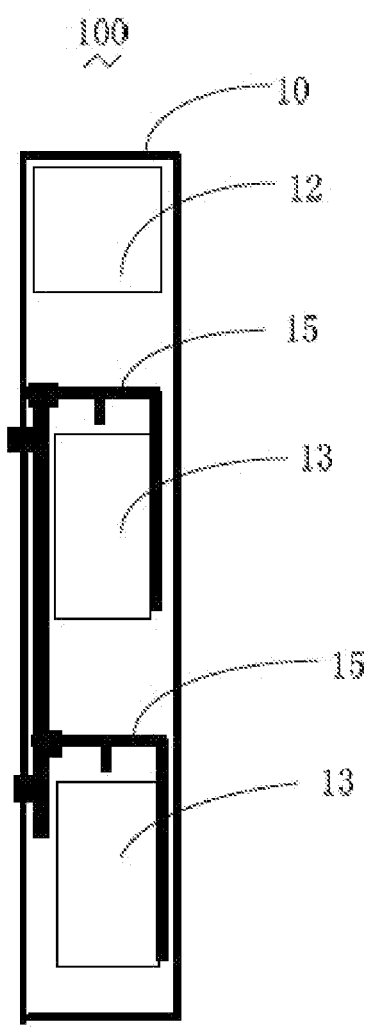
FIG. 2 is a structural block diagram of an independent graphics card system provided by Embodiment 1 of the present disclosure.

Referring to FIGS. 1 and 2, Embodiment one of the present invention provides an independent graphics card system 100. The independent graphics card system 100 includes a graphics card box 10, an expansion motherboard 11, a system power supply 12, two dual-slot graphics cards 13 and a fan assembly 14. The expansion motherboard 11, the system power supply 12, the two dual-slot graphics cards 13, and the fan assembly 14 are all arranged inside the graphics card box 11.

The system power supply 12 is a 1U power supply, electrically connected to the expansion motherboard 11. The system power supply 12 is configured to supply power to the expansion motherboard 11. The two dual-slot graphics cards 13 are respectively plugged into the expansion motherboard 11 through two adapter cards 15. The two dual-slot graphics cards 13 are arranged side by side and spaced apart, and the two dual-slot graphics cards 13 are parallel to the expansion motherboard 11.

Specifically, the expansion motherboard 11 comprises two adapter card slots spaced from each other. One end of each adapter card 15 comprises a gold finger, and the other end comprises a graphics card slot. The two golden fingers of the two adapter cards 15 are respectively plugged into the two adapter card slots of the expansion motherboard 11, and the two dual-slot graphics cards 13 are respectively plugged into the two adapter cards 15. So that, the two dual-slot graphics cards 13 are able to be plugged into the expansion motherboard 11 respectively. The two dual-slot graphics cards 13 are arranged side by side and spaced apart, and the two dual-slot graphics cards 13 are arranged in parallel with the expansion motherboard 11.

The two adapter cards 15 are respectively arranged on two adapter brackets, and the two adapter brackets are respectively fixed in the graphics card box 10 through adapter bracket fixing devices, so that the two dual-slot graphics cards 13 are plugged in the expansion motherboard 11.

The fan assembly 14 is fixed in the graphics card box 10 through a fan bracket. The fan assembly 14 is arranged around the two dual-slot graphics cards 13 to form a plurality of heat dissipation channels. The heat dissipation channels have an inlet and an outlet. The inlet faces the two dual-slot graphics cards 13, and the outlet communicates with the outside of the graphics card box 10 for heat exchange.

A maximum power of the dual-slot graphics card 13 is 350 watts. Since the independent graphics card system 100 of the embodiment one comprises two dual-slot graphics cards 13, a maximum power of the independent graphics card system 100 is 700 watts. Moreover, the independent graphics card system 100 can use the existing 1U power supply to power additional high-power graphics cards, and is suitable for fixing with mainstream 1U server brackets.

The independent graphics card system 100 of the embodiment one can also include only a dual-slot graphics card 13 and an adapter card. The dual-slot graphics card 13 is plugged into the expansion motherboard 11 through the adapter card. It is not limited to this. It can also be designed according to actual needs.

The independent graphics card system 100 is connected to a computer motherboard through an adapter card or a data cable, and serves as a graphics card expansion system of the computer.

Embodiment Two

Figure 3:
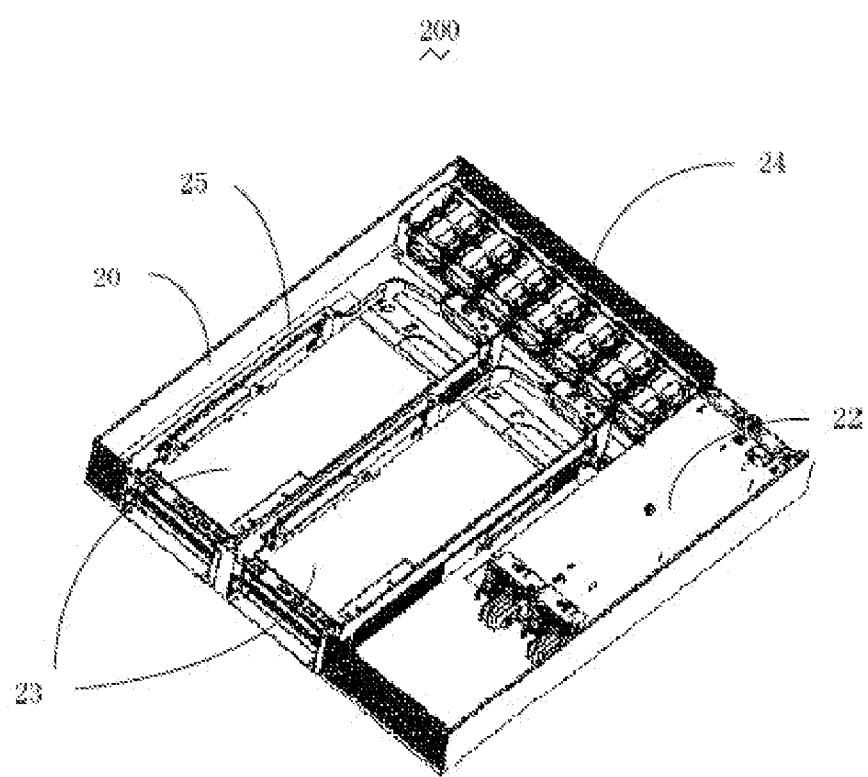
FIG. 3 is a schematic structural diagram of an independent graphics card system provided by Embodiment 2 of the present disclosure.
Figure 4:
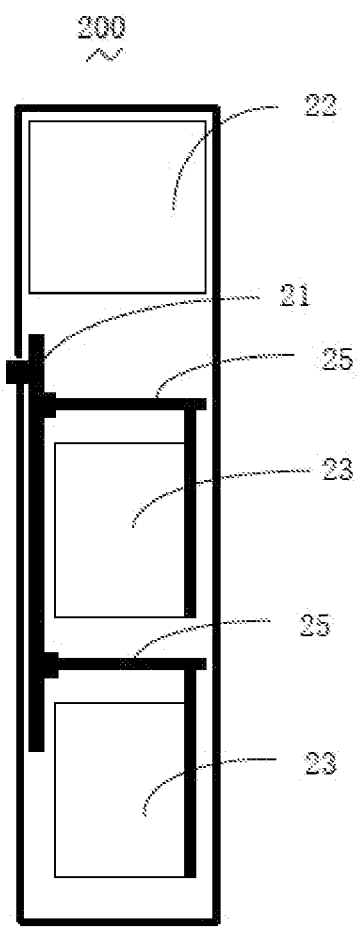
FIG. 4 is a structural block diagram of an independent graphics card system provided by Embodiment 2 of the present disclosure.

Please refer to FIGS. 3 and 4, Embodiment two of the present invention provides an independent graphics card system 200. The independent graphics card system 200 includes a graphics card box 20, an expansion motherboard 21, a system power supply 22, two three-slot graphics cards 23 and a fan assembly 24. The expansion motherboard 21, the system power supply 22, the two three-slot graphics cards 23 and the fan assembly 24 are all arranged inside the graphics card box 21.

The system power supply 22 is electrically connected to the expansion motherboard 21. The system power supply 22 is configured to provide power to the expansion motherboard 21. The two three-slot graphics cards 23 are respectively plugged into the expansion motherboard 21 through two adapter cards 25. The two three-slot graphics cards 23 are arranged side by side and spaced apart. The two three-slot graphics cards 23 are parallel to the expansion motherboard 21.

Specifically, the expansion motherboard 21 comprises two adapter card slots spaced apart from each other. One end of the adapter card 25 comprises a gold finger, and the other end comprises a graphics card slot. The two golden fingers of the two adapter cards 15 are respectively plugged into the two adapter card slots of the expansion motherboard 11. The two three-slot graphics cards 23 are plugged into the adapter card slots of the adapter card 15, thereby realizing that the two three-slot graphics cards 23 are respectively plugged into all the adapter card slots. As for the expansion motherboard 21, the two three-slot graphics cards 23 are arranged side by side and spaced apart, and the two three-slot graphics cards 23 are both arranged in parallel with the expansion motherboard 21.

The two adapter cards 25 are respectively arranged on the two adapter brackets, and the two adapter brackets are respectively fixed in the graphics card box 20 through adapter bracket fixing devices. So that the two three-slot graphics cards 23 are plugged in the expansion motherboard 21.

The fan assembly 24 is fixed in the graphics card box 20 through a fan bracket. The fan assembly 24 is arranged around the two three-slot graphics cards 23 to form a plurality of heat dissipation channels. The heat dissipation channels have an inlet and an outlet. The inlet faces the two three-slot graphics cards 23, and the outlet communicates with the outside of the graphics card box 20 for heat exchange.

A maximum power of the three-slot graphics card 23 is 600 watts. Since the independent graphics card system 200 of the embodiment two has two three-slot graphics cards 23, a maximum power of the independent graphics card system 200 is 1200 watts. Moreover, the independent graphics card system 200 requires a power supply that is thicker than the 1U power supply, and a matching server bracket and chassis need to be designed.

The independent graphics card system 200 of the embodiment two can also comprise only a three-slot graphics card 23 and an adapter card. The three-slot graphics card 23 is plugged into the expansion motherboard 21 through the adapter card. It is not limited to this. It can also be designed according to actual needs.

The independent graphics card system 200 is connected to a computer motherboard through an adapter card or a data cable, and serves as a graphics card expansion system of the computer.

The independent graphics card system of this embodiment does not affect the layout design of the existing graphics card system, and is just an expanded system; the independent graphics card system has a fan assembly and an independent heat dissipation channel, which can provide better heat dissipation for high-power graphics cards without affecting the existing graphics card system. There is heat dissipation for the graphics card system; the independent graphics card system is equipped with an additional power supply, which can power more high-power graphics cards.

The present invention further provides a computer host. The computer host comprises a computer motherboard, a host power supply, a graphics card system and an independent graphics card system. The graphics card system comprises at least one graphics card. The independent graphics card system can be the independent graphics card system of the embodiment one or embodiment two. The host power supply is electrically connected to the computer motherboard and supplies power to the computer motherboard. The graphics card is inserted into the graphics card slot of the computer motherboard. The independent graphics card system is connected to the computer motherboard through a data cable or an adapter card, and the expansion graphics card in the independent graphics card system is arranged in parallel with the computer motherboard.

Figure 5:
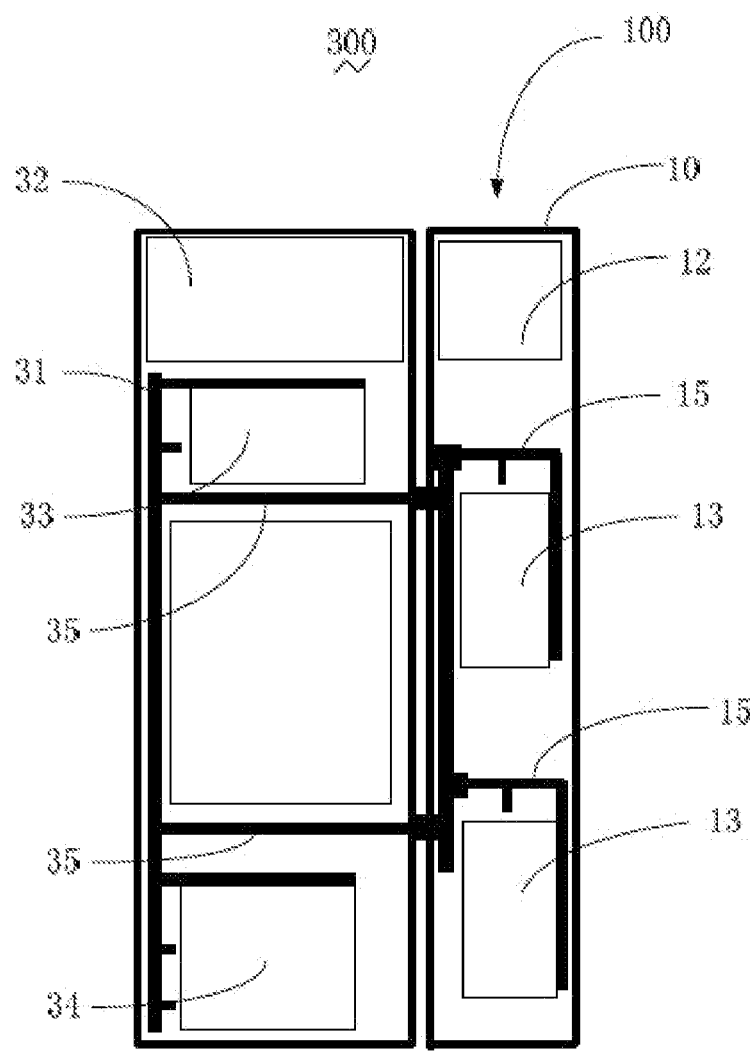
FIG. 5 is a structural block diagram of a computer host with an independent graphics card system provided by an embodiment of the present disclosure.

Please refer to FIG. 5, an embodiment of the present invention provides a computer host 300. The computer host 300 comprises a computer motherboard 31, a host power supply 32, a graphics card system and an independent graphics card system. The graphics card system comprises a dual-slot graphics card 33 and a three-slot graphics card 34. The independent graphics card system is the independent graphics card system 100 disclosed in the embodiment one, and the specific structure will not be repeated here. The host power supply 32 is electrically connected to the computer motherboard 31 and supplies power to the computer motherboard 31. The dual-slot graphics card 33 and the three-slot graphics card 34 are respectively plugged into the graphics card slots of the computer motherboard 31. The expansion motherboard 11 in the independent graphics system 100 is connected to the computer motherboard 31 through two adapter cards 35, thereby realizing the connection between the independent graphics system 100 and the computer motherboard 31, and the expansion graphics card in the independent graphics system 100 parallel to the computer motherboard 31.

A maximum power that the graphics card system of the computer host 300 can provide is 350 W+600 W=950 W. A maximum power that the independent graphics card system of the computer host 300 can provide is 350 W*2=700 W. Therefore, a maximum power that the computer host 300 can provide is 950 W+700 W=1650 W.

It can be understood that the number and specifications of the graphics cards in the computer host graphics card system are not limited to this embodiment, and can also be other quantities or specifications.

Figure 6:
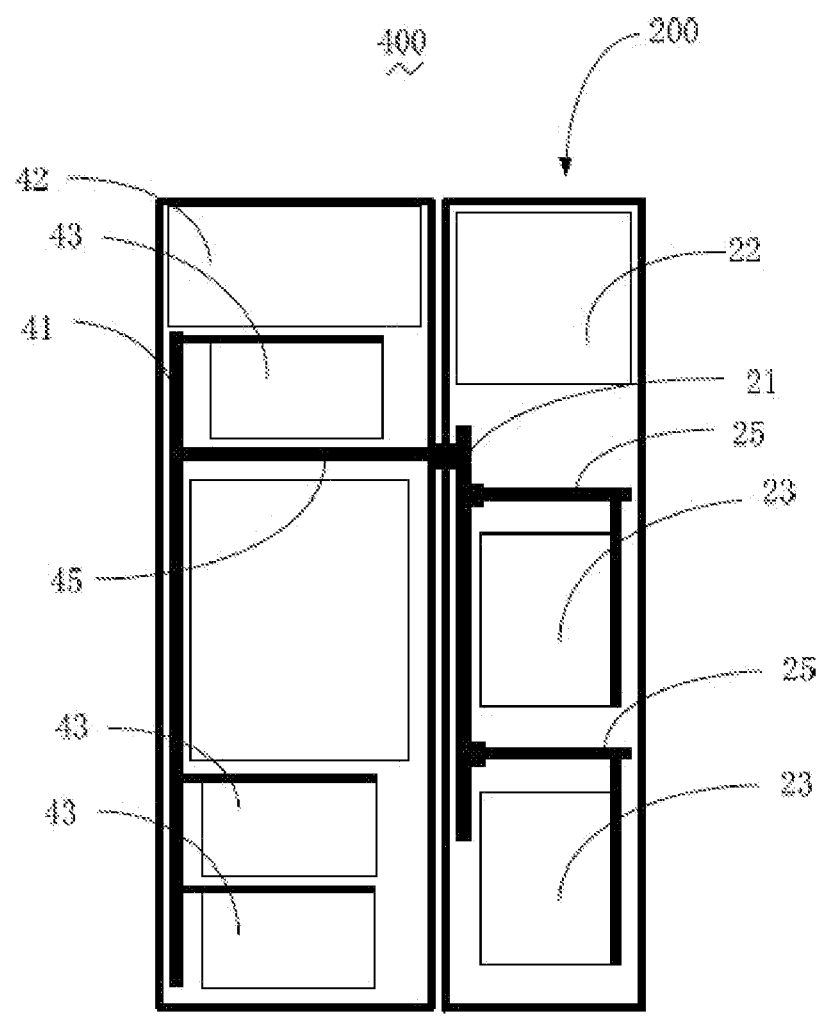
FIG. 6 is a structural block diagram of a computer host with an independent graphics card system according to another embodiment of the present disclosure.

Please refer to FIG. 6, an embodiment of the present invention provides a computer host 400. The computer host 400 comprises a computer motherboard 41, a host power supply 42, a graphics card system and an independent graphics card system. The graphics card system comprises three dual-slot graphics cards 43. The independent graphics card system is the independent graphics card system 200 of the embodiment two, and the specific structure will not be described again here. The host power supply 42 is electrically connected to the computer motherboard 41 and supplies power to the computer motherboard 41. The three dual-slot graphics cards 43 are respectively inserted into the graphics card slots of the computer motherboard 41. The expansion motherboard 21 in the independent graphics system 200 is connected to the computer motherboard 41 through an adapter card 45, thereby realizing the connection between the independent graphics system 200 and the computer motherboard 41, and the expansion graphics card in the independent graphics system 200 is connected to the computer motherboard 41 and parallel with the computer motherboard 41.

A maximum power that the graphics card system of the computer host 400 can provide is 350 W*3=1050 W. A maximum power that the independent graphics card system of the computer host 400 can provide is 600 W*2=1200 W. Therefore, a maximum power that the computer host 400 can provide is 1050 W+1200 W=2250 W.

It can be understood that the number and specifications of the graphics cards in the computer host graphics card system are not limited to this embodiment, and can also be other quantities or specifications. For example, the graphics card system comprises two dual-slot graphics cards and one single-slot graphics card, and each graphics card is respectively plugged into the graphics card slot of the computer motherboard. It is understood that the graphics card system is not limited to this, and can also be designed according to actual needs.

Because the computer in the embodiment of the present invention has an independent graphics card system, it does not affect the layout design of the existing graphics card system and is just an expanded system; the independent graphics card system has a fan assembly and an independent heat dissipation channel, which can provide better heat dissipation for high-power graphics cards, and does not affect the heat dissipation of the existing graphics card system; the independent graphics card system is equipped with an additional power supply, which can power more high-power graphics cards; moreover, the maximum graphics card power supported by the computer is greatly increased, and can be applied to some applications with special requirements field.

The invention provides a computer. The computer includes a display and a computer host. The computer host is any computer host disclosed in the embodiments of the invention.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

Depending on the embodiment, certain of the steps of methods described may be removed, others may be added, and the sequence of steps may be altered. The description and the claims drawn to a method may comprise some indication in reference to certain steps. However, the indication used is only to be viewed for identification purposes and not as a suggestion for ordering the steps.

What is claimed is:

1. An independent graphics card system, comprising:
an expansion motherboard, a system power supply, at least one expansion graphics card and a fan assembly, wherein the system power supply is electrically connected to the expansion motherboard, and the at least one expansion graphics card is plugged into the expansion motherboard through an adapter card, the at least one expansion graphics card is parallel with the expansion motherboard, and the fan assembly is configure to dissipate heat from the at least one expansion graphics card.

2. The independent graphics card system of claim 1, wherein the expansion motherboard comprises an adapter card slot, one end of the adapter card comprises a golden finger, and another end of the adapter card comprises a graphics card slot.

3. The independent graphics card system of claim 2, wherein the golden finger of the card is inserted into the adapter card slot of the expansion motherboard, and the at least one expansion graphics card is inserted into the graphics card slot of the adapter card.

4. The independent graphics card system of claim 1, wherein the independent graphics card system is connected to the computer motherboard through an adapter card or a data cable.

5. The independent graphics card system of claim 1, further comprising a graphics card box, an adapter bracket and an adapter bracket fixing device, wherein the adapter card is arranged on the adapter bracket, the adapter card bracket is fixed in the graphics card box through the adapter bracket fixing device.

6. The independent graphics card system of claim 1, wherein the fan assembly is fixed in a graphics card box through a fan bracket.

7. The independent graphics card system of claim 6, wherein the fan assembly comprises a plurality of heat dissipation channels configured to dissipate heat from the graphics card.

8. A computer host, comprising:
a computer motherboard;
a host power supply;
a graphics card system, wherein the graphics card system comprises at least one graphics card, the host power supply is electrically connected to the computer motherboard and supplies power to the computer motherboard, and the graphics card is inserted into a graphics card slot of the computer motherboard;
an independent graphics card system, wherein the independent graphics card system comprises an expansion motherboard, a system power supply, at least one expansion graphics card, and a fan assembly, the system power supply is electrically connected to the expansion motherboard, the expansion graphics card is plugged into the expansion motherboard through an adapter card, the expansion graphics card is parallel with the expansion motherboard, and the fan assembly is configured to dissipate heat from the expansion graphics card;
wherein the independent graphics card system is connected to the computer motherboard through a data cable or an adapter card, and the expansion graphics card in the independent graphics card system is parallel with the computer motherboard.

9. The computer host of claim 8, wherein the expansion motherboard is provided with an adapter card slot, one end of the adapter card is provided with a gold finger, and another end is provided with a graphics card slot, and the gold finger of the adapter card is inserted into the adapter card slot of the expansion motherboard, and the expansion graphics card is inserted into the graphics card slot of the adapter card.

10. The computer host of claim 9, wherein the independent graphics card system further comprises a graphics card box, an adapter bracket and an adapter bracket fixing device.

11. The computer host of claim 10, wherein the adapter card is arranged on the adapter bracket, the adapter bracket is fixed in the graphics card box through the adapter bracket fixing device.

12. The computer host of claim 8, wherein the fan assembly is fixed in a graphics card box through a fan bracket.

13. The computer host of claim 12, wherein the fan assembly comprises a plurality of heat dissipation channels configured for heat dissipation of the graphics card.

14. A computer, comprising a display and a computer host, wherein the computer host is the computer host according to claim 8.

* * * * *